US007919980B2

(12) United States Patent
Nakaya

(10) Patent No.: US 7,919,980 B2
(45) Date of Patent: Apr. 5, 2011

(54) CONFIGURABLE CIRCUIT AND CONFIGURATION METHOD

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 11 days.

(21) Appl. No.: 12/526,344

(22) PCT Filed: Feb. 29, 2008

(86) PCT No.: PCT/JP2008/053592
§ 371 (c)(1),
(2), (4) Date: Aug. 7, 2009

(87) PCT Pub. No.: WO2008/111406
PCT Pub. Date: Sep. 18, 2008

(65) Prior Publication Data
US 2010/0321062 A1    Dec. 23, 2010

(30) Foreign Application Priority Data

Mar. 9, 2007    (JP) .................................. 2007-060353

(51) Int. Cl.
*H01L 25/00* (2006.01)
(52) U.S. Cl. ............................... 326/41; 326/37; 326/47
(58) Field of Classification Search .................... 326/41, 326/37–39, 47
See application file for complete search history.

(56) References Cited

U.S. PATENT DOCUMENTS

| | | | | |
|---|---|---|---|---|
| 6,469,540 B2 * | 10/2002 | Nakaya | ............................. | 326/41 |
| 7,765,249 B1 * | 7/2010 | Pugh et al. | ..................... | 708/230 |
| 7,797,497 B1 * | 9/2010 | Schmit et al. | .................. | 711/149 |
| 7,825,684 B2 * | 11/2010 | Hutchings | ......................... | 326/38 |
| 7,825,685 B2 * | 11/2010 | Chandler et al. | ................. | 326/38 |
| 7,825,687 B2 * | 11/2010 | Redgrave | .......................... | 326/38 |
| 2001/0052793 A1 | 12/2001 | Nakaya | | |
| 2002/0186045 A1 | 12/2002 | Cox | | |

FOREIGN PATENT DOCUMENTS

| | | | |
|---|---|---|---|
| EP | 1345328 | A | 9/2003 |
| JP | 11-353152 | A | 12/1999 |
| JP | 2002076883 | A | 3/2002 |
| JP | 2005057452 | A | 3/2005 |
| JP | 2005101535 | A | 4/2005 |
| JP | 2005158815 | A | 6/2005 |
| JP | 2005317978 | A | 11/2005 |

OTHER PUBLICATIONS

International Search Report for PCT/JP2008/053592 mailed May 20, 2008.
Supplementary European Search Report for EP 08 72 1040 completed Dec. 14, 2010.

* cited by examiner

*Primary Examiner* — James H. Cho
*Assistant Examiner* — Matthew C Tabler

(57) ABSTRACT

A configurable circuit of the present invention includes a plurality of logic blocks (4), and a programmable bus which can program connections of plurality of logic blocks (4). The programmable bus includes a plurality of wires ($11\_x$) arranged for each of signal transmission ranges corresponding to plurality of logic blocks (4), direct wire connection switch ($711\_x$) which can program whether to directly connect or disconnect the wires between the adjacent signal transmission ranges, input selector ($30\_x$) which can program a connection with any one of the plurality of wires, and programmable switch ($40\_x$) which can program whether to make a connection with the wire corresponding to the adjacent signal transmission range for each of the plurality of wires. A plurality of programmable switches ($40\_x$) are arranged for at least one of plurality of logic blocks (4).

18 Claims, 11 Drawing Sheets

CONFIGURABLE CIRCUIT AND CONFIGURATION METHOD

This application is the National Phase of PCT/JP2008/053592, filed Feb. 29, 2008, which is based upon and claims the benefit of priority from Japanese Patent Application No. 2007-060353 filed on Mar. 9, 2007, the content of which is incorporated by reference.

TECHNICAL FIELD

The present invention relates to a configurable circuit and a configuration method which can program connections of a plurality of logic blocks.

BACKGROUND ART

A configurable circuit where a plurality of logic blocks are connected in a programmable wire structure, such as a Field Programmable Gate Array (FPGA) or a Programmable Logic Device (PLD), has been widely used.

FIG. 1 is a block diagram illustrating a configuration example of a related FPGA. The FPGA is composed of arrangements of programmable cells 201_$x$ ($x$ is an integer). Although the arrangements are normally two-dimensional, FIG. 1 shows one-dimensional arrangements as a part.

For example, like programmable cell 201_1, each of the programmable cells includes programmable logic block 4, wire group 10, programmable switches 2$x$_$y$ ($x$ and $y$ are integers), and input selectors 3_$x$ ($x$ is an integer). As illustrated in FIG. 1, programmable cell 201_1 includes programmable switches 21_1, 21_2 and 22_2 and input selectors 3_1 and 3_2. Programmable logic block 4 has a plurality of input terminals (A and B of FIG. 1) and output terminal C, and realizes a variety of logic functions based on data (configuration data) recorded on a configuration memory (not shown).

Wire group 10 is to transmit data between different programmable cells. Programmable switch 2$x$_$y$ connects wire 1$x$_$y$ or output terminal C of programmable logic block 4 to an adjacent wire, or disconnects the adjacent wires ($x$ and $y$ are integers). Input selector 3_$x$ ($x$ is an integer) selects a signal transmitted via one wire of wire group 10, and supplies the selected signal to the input terminal (A and B of FIG. 1) of programmable logic block.

FIG. 2 is a block diagram illustrating a configuration example of related programmable switch 2$x$_$y$ ($x$ and $y$ are integers). This switch executes any one of the following three functions according to configuration data.

Select a signal input to any one of terminals T0 and T using selector 3_4, and output the signal to terminal T1 via tristate buffer 5_2.
Select a signal input to any one of terminals T1 and T using selector 3_3, and output the signal to terminal T0 via tristate buffer 5_1.
Disconnect terminals T0 and T1.

Generally, in the FPGA, wire group 10 is composed of plural kinds of wires. FIG. 1 shows an example in which wire group 10 is composed of short distance wire group 11 and long distance wire group 12. Short distance wire group 11 has a length equivalent to a width of the programmable cell, and is appropriate for signal transmission between the neighboring programmable cells. Long distance wire group 12 has a length equivalent to two widths of the programmable cell, and is appropriate for signal transmission between the programmable cells spaced apart from each other over two cells.

Actually, since 'delay of short distance wire<delay of long distance wire' is satisfied, connecting adjacent cells via the short distance wire is advantageous in terms of signal transmission. On the other hand, since 'delay of short distance wire×2>delay of long distance wire' is satisfied, connecting the cells spaced apart over two cells via the long distance wire rather than the short distance wire is advantageous in terms of signal transmission.

As described above, plural kinds of wires should be prepared to accomplish high speed signal transmission. Although FIG. 1 shows two kinds of wires for simplification, actually, more kinds of wires are necessary. Accordingly, the number of the wires increases, so that the area of the programmable cell increases.

In addition, since it is necessary to have the same number of programmable switches 2$x$_$y$ as wires, they occupy a large area. Particularly, since tristate buffers (5_1 and 5_2 of FIG. 2) in programmable switch 2$x$_$y$ annexed to the long distance wire need a large driving force, they also occupy a large area.

Recently, a switch element (hereinafter, referred to as Memory-type low resistance switch element) was developed which can programmably set a high resistance state and a low resistance state, can memorize the set state to be non-volatile, and which has a much lower ON resistance than a MOS transistor of the same occupancy area. An example has been disclosed in Japanese Laid-Open Patent Publication No. 2005-101535. FIG. 3 shows a configuration example of the switch element.

As illustrated in FIG. 3, the memory-type low resistance switch element includes metal electrode 60 which is difficult to ionize, metal electrode 62 which is easy to ionize, and electrolyte 61. Both metal electrodes are connected or disconnected according to a method for applying a voltage between metal electrode 60 which is difficult to ionize and metal electrode 62 which is easy to ionize. Since a resistance of connection of these electrodes is much lower than that of the MOS transistor of the same occupancy area (by over a number of one cipher), it is possible to realize a high performance switch with a small area. Moreover, since the connection or disconnection state once formed is maintained for a certain period of time, memory for memorization is not necessary. As a result, a circuit using the memory-type low resistance switch element can be implemented in a smaller area than a circuit which does not use the same.

In the meantime, there are different kinds of memory-type low resistance switch elements. An example of different kinds of switch elements has been disclosed in Japanese Laid-Open Patent Publication No. 2005-317978.

DISCLOSURE OF INVENTION

It is expected that the memory-type low resistance switch element will be applied to the configurable circuit which uses a lot of switches because of the excellent performance of the memory-type low resistance switch element described above. However, in the configurable circuit of FIG. 1, even if the switches (e.g. selectors and tristate buffers) that used to be manufactured of MOS transistors are manufactured of the memory-type low resistance switch elements, the overall circuit area is seldom reduced. As explained in connection with the FPGA of FIG. 1, since the configurable circuit normally includes a plurality of wires and large buffers which occupy a large area, narrowing the switch portions does not sufficiently contribute to a reduction of the overall circuit area.

An object of the present invention is to provide a configurable circuit and a configuration method which can reduce the circuit area.

A configurable circuit of the present invention includes a plurality of logic blocks, and a programmable bus which can program connections of the plurality of logic blocks, wherein the programmable bus comprises a plurality of wires which are arranged for each of signal transmission ranges corresponding to the plurality of logic blocks and which connect adjacent logic blocks; a direct wire connection switch which can program whether to directly connect or disconnect the wires between adjacent the signal transmission ranges; an input selector which is arranged to correspond to each of the plurality of logic blocks, which can program a connection with any one of the plurality of wires, and which supplies a signal of a connected wire to the logic block; and a programmable switch which is arranged for each of the signal transmission ranges and which can program whether to make a connection with the wire corresponding to adjacent the signal transmission range via a buffer for each of the plurality of wires, a plurality of programmable switches being arranged for at least one of the plurality of logic blocks.

In accordance with the present invention, as compared with the related configurable circuit, the number of the wires and the occupancy area of the buffers are reduced, so that the overall circuit area can be reduced.

Figure 1:
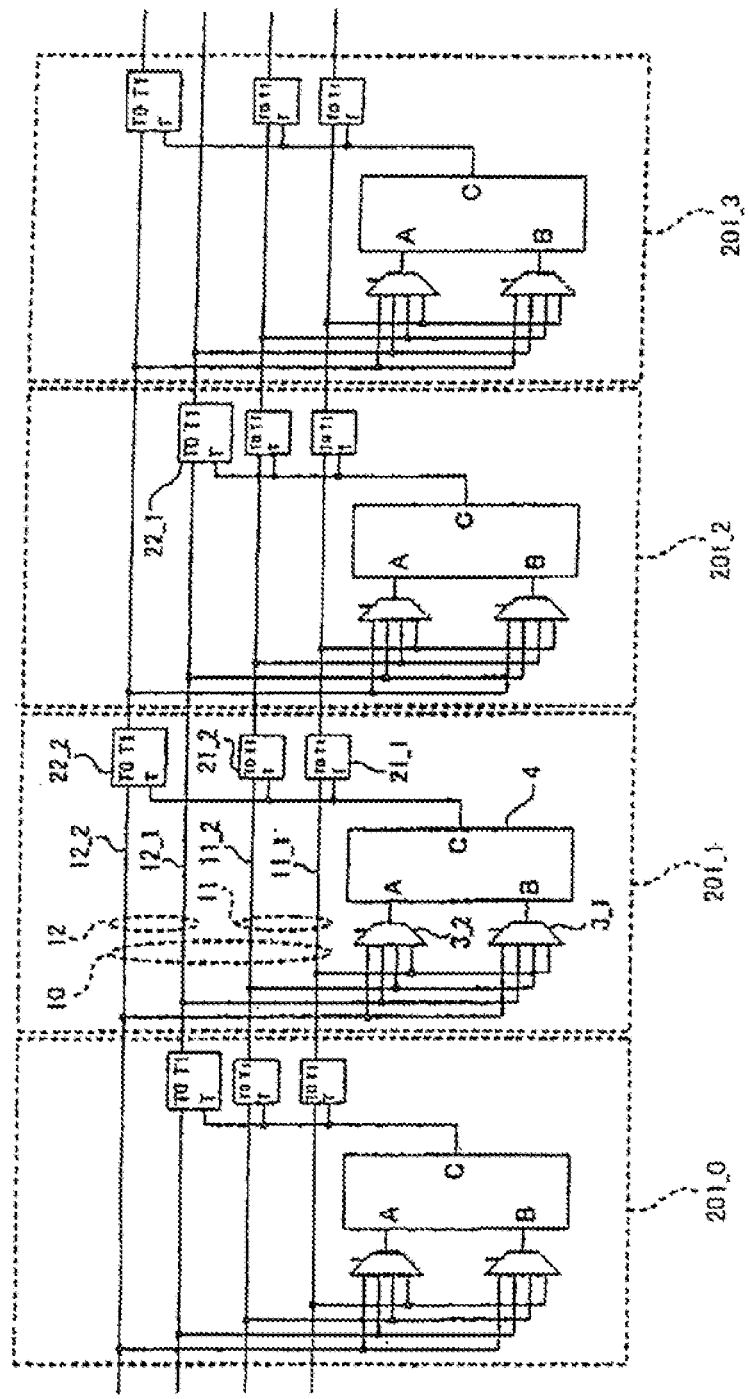
FIG. 1 is a block diagram illustrating a configuration example of a related FPGA.
Figure 2:
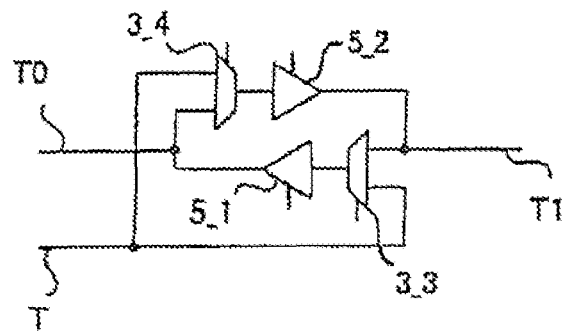
FIG. 2 is a block diagram illustrating a configuration example of a related programmable switch.

DESCRIPTION OF REFERENCE CHARACTERS 1, 1a, 1b, 1__x, 201__x: Programmable cell
3__x, 30, 30__x: Input selector
4: Programmable logic block
5__x: Tristate buffer
10: Wire group
11: Short distance wire group
11b: Horizontal short distance wire group
11__x: Short distance wire
11__xb: Horizontal short distance wire
12: Long distance wire group
12__x: Long distance wire
15: Vertical short distance wire group
15__x: Vertical short distance wire
2x__y, 40__x: Programmable switch
711__x, 715__x: Direct wire connection switch
730__x, 731__x: Memory-type low resistance switch element
31: Output selector
50: Buffer
60: Metal electrode which is difficult to ionize
61: Electrolyte
62: Metal electrode which is easy to ionize
90: I/O cell
100: Chip
305, 306, 307, 308: Logic block
A, B: Input terminal
C: Output terminal
T0, T1, T2, T3, T4, T5, T6, T7, T: Terminal
t0, t1, t2, t3, t4, t: Terminal

BEST MODE FOR CARRYING OUT THE INVENTION

First Exemplary Embodiment

Figure 4:
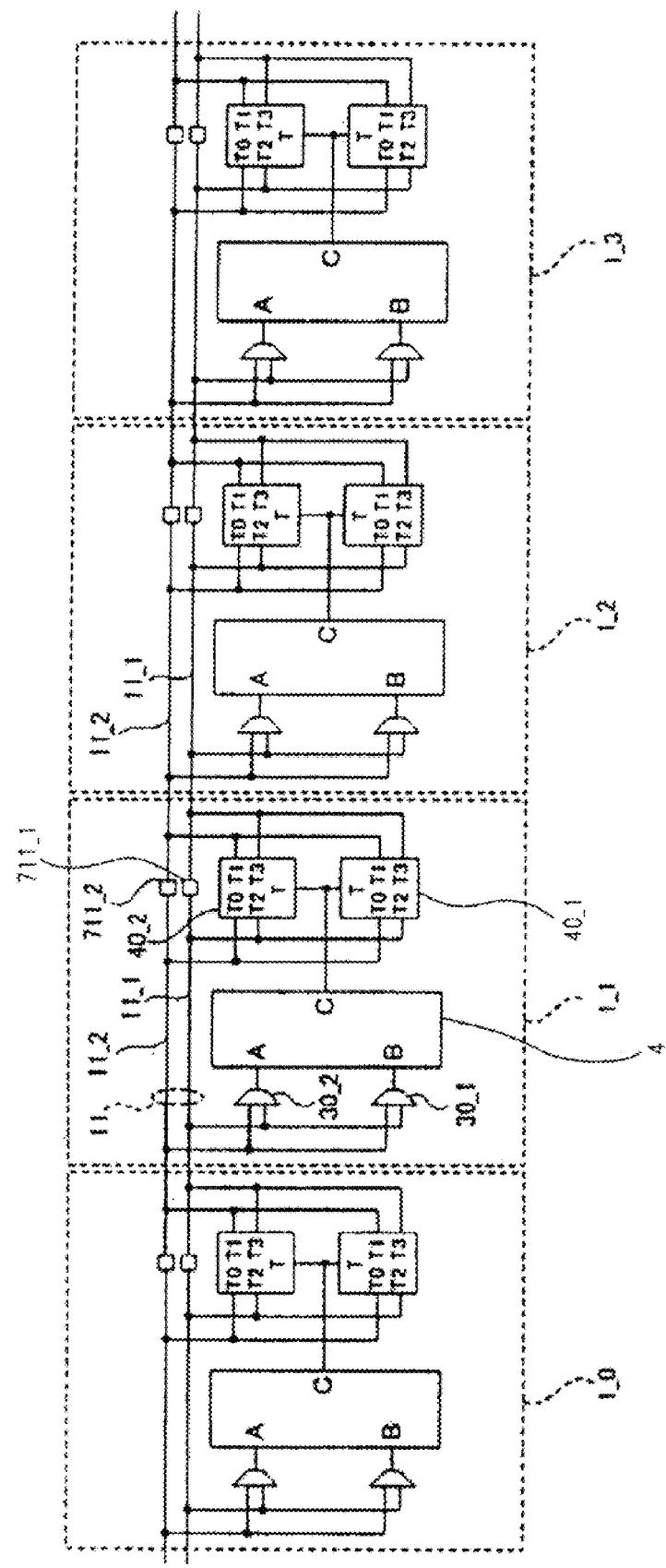
FIG. 4 is a block diagram illustrating a configuration example of a configurable circuit of a first exemplary embodiment.

The first exemplary embodiment of the present invention will be explained. FIG. 4 is a block diagram illustrating a configuration example of a configurable circuit of this exemplary embodiment.

As illustrated in FIG. 4, the configurable circuit of this exemplary embodiment is composed of arrangements of plurality of programmable cells 1__x (x is an integer). For example, like programmable cell 1_1, each of the programmable cells includes programmable logic block 4, short distance wire group 11, direct wire connection switches 711__y, programmable switches 40__y, and input selectors 30y (y is an integer). A programmable bus arranged between plurality of programmable logic blocks 4 includes short distance wire group 11, direct wire connection switches 711__y, programmable switches 40__y, and input selectors 30__y.

Programmable logic block 4 has a plurality of input terminals (A and B of FIG. 4) and output terminal C, and realizes a variety of logic functions based on data recorded on a configuration memory (not shown).

Short distance wire group 11 is to transmit data between different programmable cells. In the example of FIG. 4, short distance wire group 11 includes plurality of short distance wires 11__y (y is an integer) having a length equivalent to a width of the programmable cell. Among the plurality of wires connecting the plurality of programmable logic blocks 4, the plurality of short distance wires 11__y between direct wire connection switches 711__y correspond to signal transmission ranges of the present invention.

Figure 3:
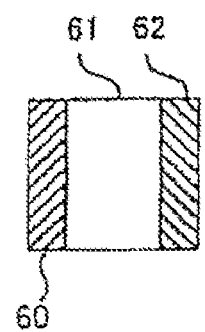
FIG. 3 is a schematic sectional view illustrating a configuration example of a memory-type low resistance switch element.

Direct wire connection switch 711__y is a memory-type low resistance switch element which programmably connects or disconnects the adjacent short distance wires 11__y. The memory-type low resistance switch element is constructed as explained with reference to FIG. 3. Metal electrode 60 which is difficult to ionize is connected to short distance wire 11__y of programmable cell 1__k (k is an arbitrary integer), and metal electrode 62 which is easy to ionize is connected to short distance wire 11__y of programmable cell 1__k+1.

Meanwhile, such different kinds of metal electrodes may be disposed reversely. As mentioned above, short distance wires 11_$y$ of the adjacent programmable cells are connected to metal electrode 60 which is difficult to ionize and metal electrode 62 which is easy to ionize, respectively.

Programmable switch 40_$z$ ($z$ is an integer) programmably outputs a signal of any one of terminals T0, T1, T2, T3 and T to at least one of terminals T0, T1, T2 and T3 (in this case, input and output terminals are different), or disconnects the terminals.

Here, connections between terminals T0, T1, T, T2 and T3 and short distance wire group 11 will be explained. Terminal T0 is connected to short distance wire 11_2 of programmable cell 1_1, and terminal T1 is connected to short distance wire 11_2 of programmable cell 1_2. Terminal T2 is connected to short distance wire 11_1 of programmable cell 1_1, and terminal T3 is connected to short distance wire 11_1 of programmable cell 1_2. Terminal T is connected to terminal T of another programmable switch in the same programmable cell. In programmable cell 1_1, as shown in FIG. 4, terminals T of programmable switches 40_1 and 40_2 are connected to each other. Also, output terminal C of programmable logic block 4 is connected to a wire connecting two terminals T.

Figure 5:
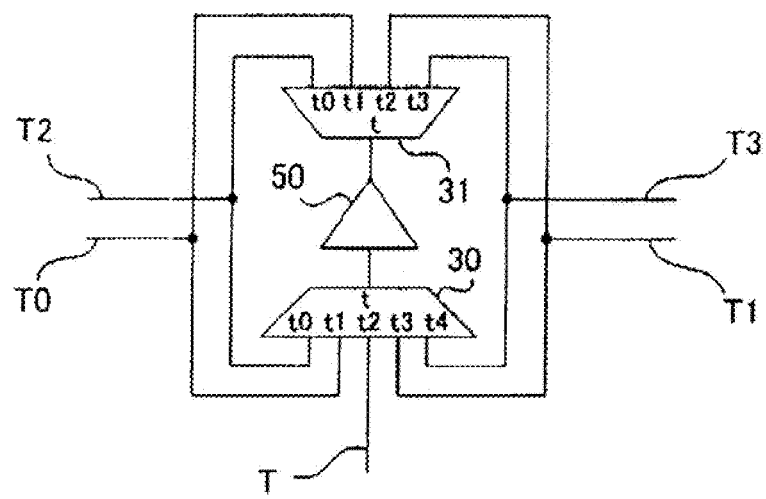
FIG. 5 is a block diagram illustrating a configuration example of a programmable switch of FIG. 4.

FIG. 5 is a block diagram illustrating a configuration example of programmable switch 40_$z$. As illustrated in FIG. 5, respective terminals T0, T1, T, T2 and T3 are connected to respective input terminals t1, t3, t2, t0 and t4 of input selector 30. Input selector 30 programmably sets whether to output a signal of any one of the input terminals to output terminal t, or not to output any signal. The output signal of input selector 30 is provided to input terminal t of output selector 31 via buffer 50. Respective terminals T0, T1, T2 and T3 are connected to respective output terminals t1, t2, t0 and t3 of output selector 31. Output selector 31 programmably sets whether or not to output a signal of input terminal t to each of output terminals t0, t1, t2 and t3.

Figure 6:
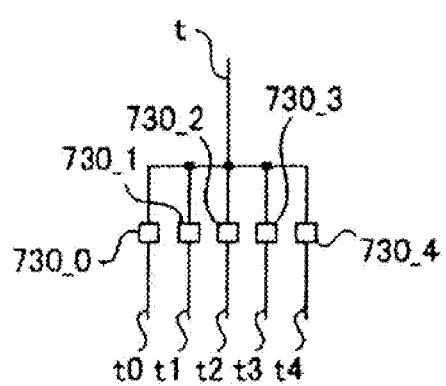
FIG. 6 is a circuit view illustrating a configuration example of an input selector of FIG. 5.

FIG. 6 is a circuit view illustrating a configuration example of input selector 30. Each of input terminals t0, t1, t2, t3 and t4 is connected to one of two metal electrodes of each of memory-type low resistance switch elements 730_0, 730_1, 730_2, 730_3 and 730_4. Also, the other metal electrodes of memory-type low resistance switch elements 730_0, 730_1, 730_2, 730_3 and 730_4 are connected to form output terminal t.

Figure 7:
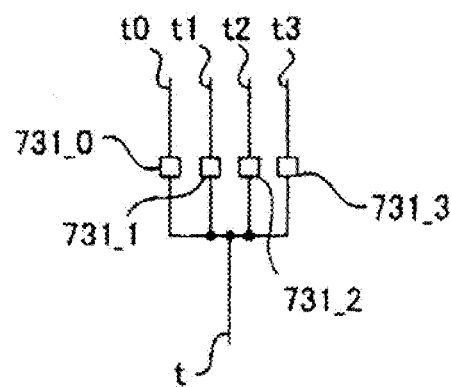
FIG. 7 is a circuit view illustrating a configuration example of an output selector of FIG. 5.

FIG. 7 is a circuit view illustrating a configuration example of output selector 31. Each of output terminals t0, t1, t2 and t3 is connected to one of two metal electrodes of each of memory-type low resistance switch elements 731_0, 731_1, 731_2 and 731_3. In addition, the other metal electrodes of memory-type low resistance switch elements 731_0, 731_1, 731_2 and 731_3 are connected to form input terminal t.

As explained above, since it is possible to programmably connect or disconnect the metal electrodes of the memory-type low resistance switch element, the programmable switch of FIG. 5 can output a signal of any one of terminals T0, T1, T2, T3 and T to at least one of terminals T0, T1, T2 and T3 (in this case, input and output terminals are different), or disconnect the terminals. Unlike the aforementioned direct wire connection switch, as shown in FIG. 5, the programmable switch is characterized in that the buffer is arranged between the input and output. This buffer has a sufficient driving force to drive one-line short distance wire (e.g. short distance wire 11_1 or 11_2 of FIG. 4).

Next, input selectors 30_1 and 30_2 of FIG. 4 will be explained. Two input terminals of input selector 30_1 are connected to short distance wires 11_1 and 11_2, respectively, and an output terminal is connected to input terminal B of programmable logic block 4. Two input terminals of input selector 30_2 are connected to short distance wires 11_1 and 11_2, respectively, and an output terminal is connected to input terminal A of programmable logic block 4.

Each of input selectors 30_1 and 30_2 of FIG. 4 selects a signal from short distance wire group 11, and supplies the selected signal to each of input terminals B and A of programmable logic block 4. These selectors basically have the same construction as that of input selector 30 of FIG. 6 except the number of the input terminals. In the related programmable cell, the input selectors are formed of MOS transistors. However, as shown in FIG. 6, when the input selectors are formed of memory-type low resistance switch elements, there is an advantage that the area and load capacity can be considerably reduced.

Next, the operation and effect of the configurable circuit of this exemplary embodiment will be explained.

Figure 8:
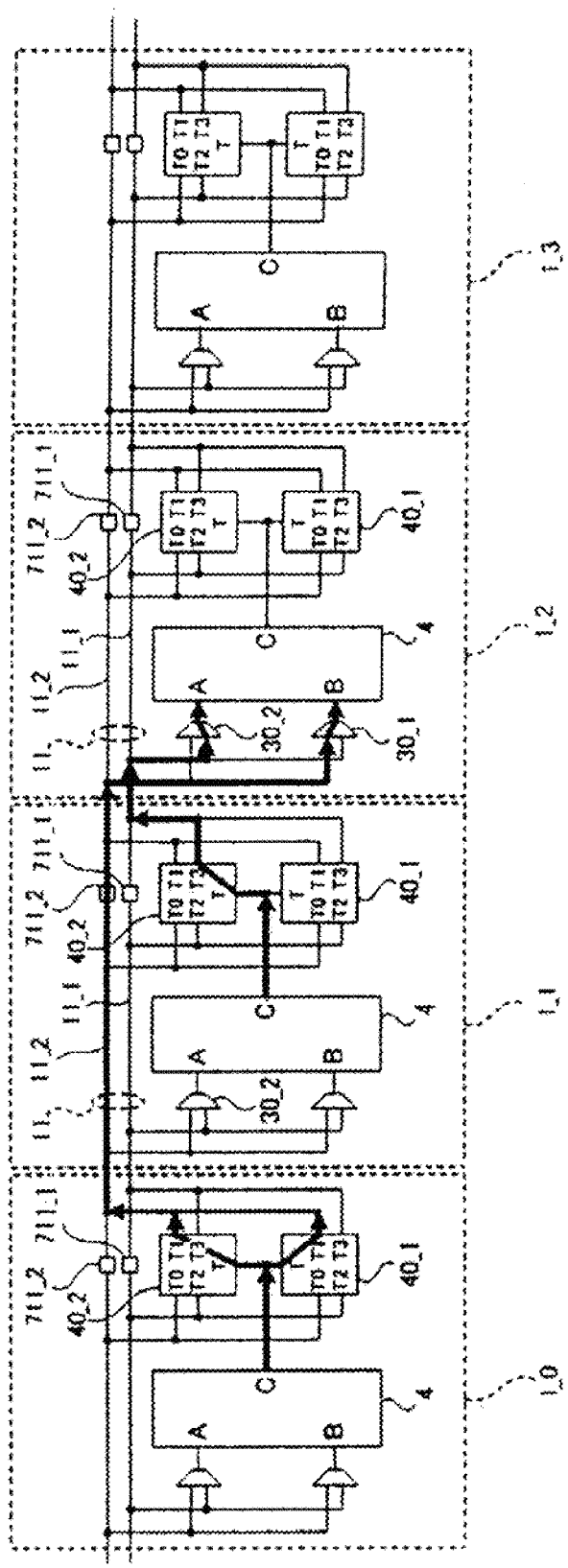
FIG. 8 is a diagram illustrating a first operation example of the configurable circuit of the first exemplary embodiment.

FIG. 8 is a diagram illustrating a first operation example of the configurable circuit of this exemplary embodiment. Thick arrows indicate signal paths, and thick lines passing through the terminals of direct wire connection switches 711_$y$, programmable switches 40_$y$ and input selectors 30_$y$ ($y$ is an integer) indicate connections of the corresponding terminals.

Here, direct wire connection switches 711_1 and 711_2 in programmable cell 1_0, direct wire connection switch 711_1 and programmable switch 40_1 in programmable cell 1_1, and direct wire connection switches 711_1 and 711_2 and programmable switches 40_1 and 40_2 in programmable cell 1_2 are all set to be disconnected.

As illustrated in FIG. 8, output terminal C of programmable logic block 4 in programmable cell 1_1 outputs a signal to short distance wire 11_1 annexed to adjacent programmable cell 1_2 via programmable switch 40_2. This signal is supplied to input terminal A of programmable logic block 4 via input selector 30_2 in programmable cell 1_2.

In addition, output terminal C of programmable logic block 4 in programmable cell 1_0 outputs a signal to short distance wire 11_2 annexed to adjacent programmable cell 1_1 via both programmable switches 40_1 and 40_2. This signal is transferred to short distance wire 11_2 annexed to programmable cell 1_2 via direct wire connection switch 711_2 in programmable cell 1_1, and supplied to input terminal B of programmable logic block 4 via input selector 30_1 in programmable cell 1_2.

Hereinafter, the operation and effect of the first operation example of FIG. 8 will be explained.

Short distance wire 11_1 annexed to programmable cell 1_2 of FIG. 8 is a single segment short distance wire that is disconnected from other short distance wires. Therefore, at least a buffer for a short distance wire, is sufficient to drive its cell. In FIG. 8, it is driven merely by programmable switch 40_2 in programmable cell 1_1.

On the other hand, so as to transmit a signal of output terminal C of programmable logic block 4 in programmable cell 1_0 to programmable cell 1_2 positioned two cells ahead, referring to FIG. 8, short distance wire 11_2 annexed to programmable cell 1_1 and short distance wire 11_2 annexed to programmable cell 1_2 are connected via direct wire connection switch 711_2 in programmable cell 1_1 to thereby form a long distance wire. Since the connection using the direct wire connection switch is a direct connection which does not pass through a buffer, the long distance wire so formed has the same load capacity as that of a wire having a segment length equivalent to two widths of the programmable cell. Therefore, in order to drive the long distance wire, as in programmable cell 1_0 of FIG. 8, the same signal (the output from output terminal C of programmable logic block 4) is output to the same short distance wire (short distance wire 11_2 annexed to programmable cell 1_1) via both programmable switches 40_1 and 40_2. As the two programmable switches are used to double the driving force, it is possible to drive the long distance wire at a high speed.

As described above, since the buffer in one programmable switch has a sufficient driving force to drive one short distance wire, if a long distance wire is driven using the one buffer, signal transmission is delayed and performance is degraded. However, like the example of FIG. 8, a sufficient driving force to drive a long distance wire can be obtained using the two programmable switches. In addition, an ON resistance of a memory-type low resistance switch is much smaller than that of a transistor. Accordingly, two short distance wires connected via the direct wire connection switch adopting the same are similar to a one-line short distance wire without a joint, which can attain high speed signal transmission.

In a case where the direct wire connection switch is formed of a transistor (e.g. a pass transistor or transmission gate), its resistance and capacity considerably increase. Even if the long distance wire is driven by a buffer with a large driving force, its performance is much lower than that of the one-line long distance wire. Moreover, switches (portions corresponding to switch elements 731_$x$ of FIG. 7) constituting an output selector (a portion corresponding to output selector 31 of FIG. 5) of a programmable switch should have a low resistance to transfer a large driving force after the buffer. If these switches are formed of the memory-type low resistance switches, they can attain the desired end with a small area. However, if these switches are formed of the transistors, they occupy a very large area and inevitably have a much smaller driving force.

According to the first exemplary embodiment of the present invention, the long distance wire is formed by the programmable connection of the short distance wires, and the buffer for the long distance wire is formed by the programmable coupling of the buffers for the short distance wire. The memory-type low resistance switch is essential to accomplish practical performance in a small area. The switch formed of the transistor cannot attain the desired end.

In the meantime, in this exemplary embodiment, the first operation example of FIG. 8 overlaps signal transmission to an adjacent programmable cell with long distance signal transmission to a programmable cell spaced apart over two programmable cells.

Figure 9:
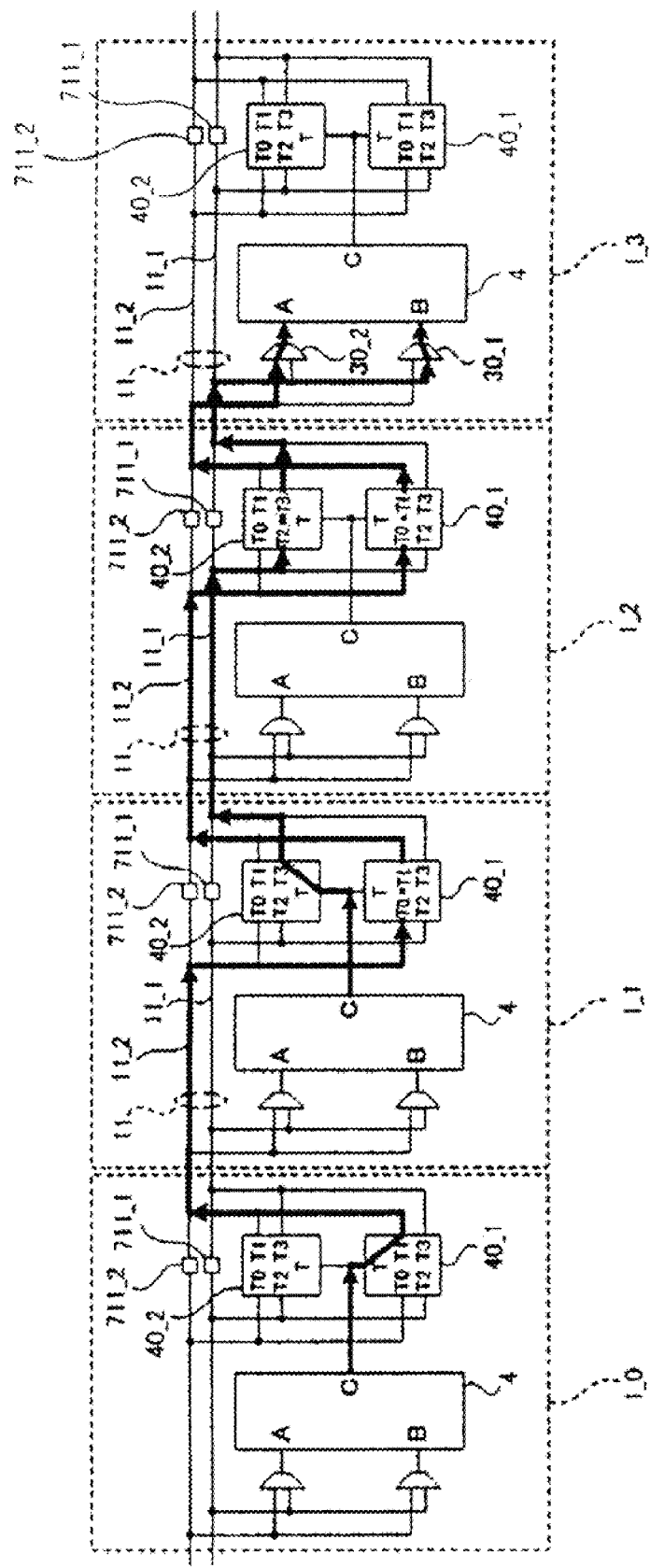
FIG. 9 is a diagram illustrating a second operation example of the configurable circuit of the first exemplary embodiment.

Next, the overlapping of two long distance signal transmissions will be explained as a second operation example of the configurable circuit of this exemplary embodiment. FIG. 9 is a diagram illustrating the second operation example of the configurable circuit of this exemplary embodiment. Thick arrows indicate those explained in the first operation example.

Here, direct wire connection switches 711_1 and 711_2 and programmable switch 40_2 in programmable cell 1_0, direct wire connection switches 711_1 and 711_2 in programmable cell 1_1, direct wire connection switches 711_1 and 711_2 in programmable cell 1_2, and direct wire connection switches 711_1 and 711_2 and programmable switches 40_1 and 40_2 in programmable cell 1_3 are all set to be disconnected.

As illustrated in FIG. 9, output terminal C of programmable logic block 4 in programmable cell 1_0 outputs a signal to short distance wire 11_2 annexed to adjacent programmable cell 1_1 via programmable switch 40_1. This signal is output to short distance wire 11_2 annexed to programmable cell 1_2 via programmable switch 40_1 in programmable cell 1_1. Thereafter, the signal is output to short distance wire 11_2 annexed to programmable cell 1_3 via programmable switch 40_1 in programmable cell 1_2, and supplied to input terminal A of programmable logic block 4 via input selector 30_2. That is, in the signal transmission from programmable cell 1_0 to programmable cell 1_3, the signal is transmitted, buffered by the programmable switch in each programmable cell on a path.

Also in FIG. 9, output terminal C of programmable logic block 4 in programmable cell 1_1 outputs a signal to short distance wire 11_1 annexed to adjacent programmable cell 1_2 via programmable switch 40_2. This signal is output to short distance wire 11_1 annexed to programmable cell 1_3 via programmable switch 40_2 in programmable cell 1_2, and supplied to input terminal B of programmable logic block 4 via input selector 30_1. That is, in the signal transmission from programmable cell 1_1 to programmable cell 1_3, the signal is transmitted, buffered by the programmable switch in each programmable cell on a path.

Hereinafter, the operation and effect of the second operation example of FIG. 9 will be explained.

In the operation example of FIG. 9, two long distance signal transmissions overlap with each other. In this case, on each signal path, it is necessary to buffer a signal through the programmable switch in each programmable cell. That is, the long distance wire using direct wire connection switch 711_1 ($y$ is an integer) is not employed. If such a long distance wire is used, since it is necessary to buffer a signal through two or more programmable switches in any programmable cell, it is impossible to secure a programmable switch for an additional one-line signal path. Although the long distance wire using direct wire connection switch 711_$y$ ($y$ is an integer) has a merit such as high speed long distance signal transmission, it uses many programmable switches. It is thus possible to use only a small number of long distance wires. On the other hand, if the short distance wires are connected via the programmable switch to transmit a signal in the same long distance, the speed is low but many signal transmissions can overlap with each other. Both wires may be appropriately used according to a state of using wires or required performance.

Figure 10:
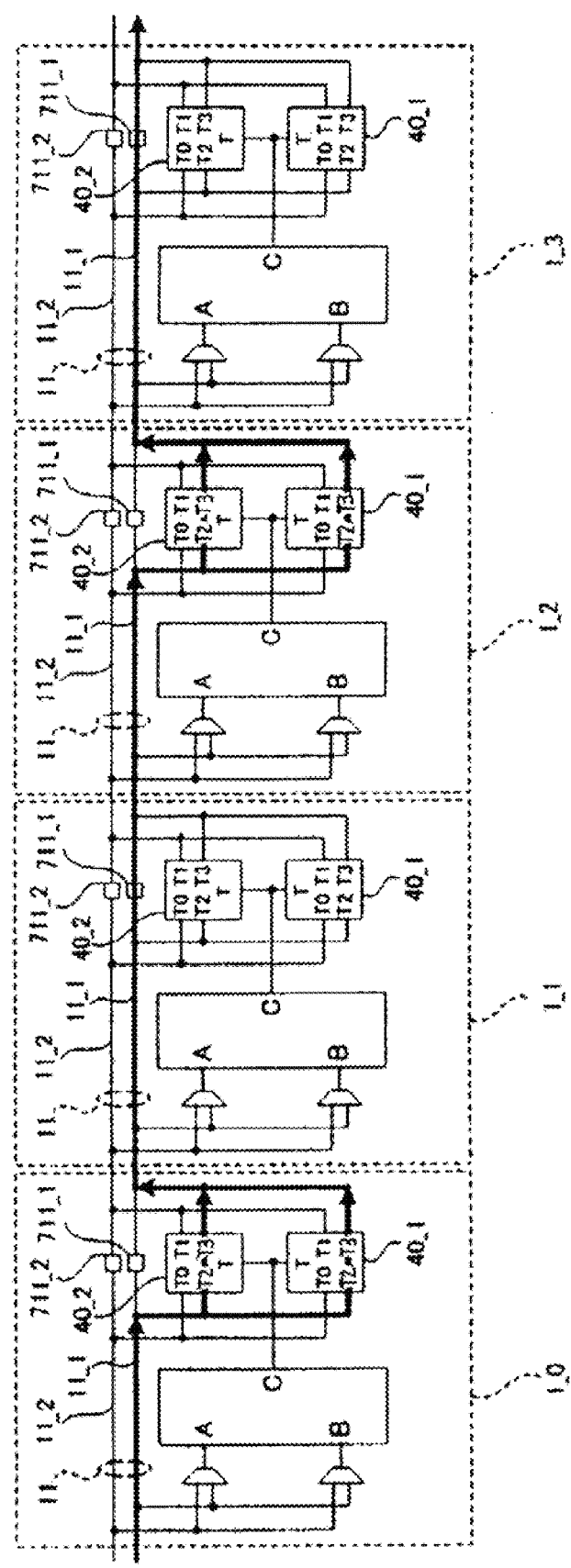
FIG. 10 is a diagram illustrating a third operation example of the configurable circuit of the first exemplary embodiment.

Next, a signal path where a long distance wire that is formed and that uses a direct wire connection switch that is connected in a plural number will be explained as a third operation example of the configurable circuit of this exemplary embodiment. FIG. 10 is a diagram illustrating the third operation example of the configurable circuit of this exemplary embodiment. Thick arrows indicate those explained in the first operation example.

Here, direct wire connection switches 711_1 and 711_2 in programmable cell 1_0, direct wire connection switch 711_2 and programmable switches 40_1 and 40_2 in programmable cell 1_1, direct wire connection switches 711_1 and 711_2 in programmable cell 1_2, and direct wire connection switch 711_2 and programmable switches 40_1 and 40_2 in programmable cell 1_3 are all set to be disconnected.

Short distance wire 11_1 annexed to programmable cell 1_0 outputs a signal to short distance wire 11_1 annexed to adjacent programmable cell 1_1 via both programmable switches 40_1 and 40_2. Short distance wires 11_1 annexed to programmable cells 1_1 and 1_2 are connected via direct wire connection switch 711_1 in programmable cell 1_1 to form a long distance wire, and the aforementioned signal is transmitted to short distance wire 11_1 annexed to programmable cell 1_2 at a high speed. Thereafter, the signal is output to an adjacent long distance wire via both programmable switches 40_1 and 40_2 in programmable cell 1_2.

As described above, in a case where the long distance wire that is formed and that uses the direct wire connection switch that is connected in a plural number, the plurality of programmable switches are used as relay buffers, thereby fulfilling high speed long distance signal transmission. This method is useful when it is not necessary to secure a programmable switch for other purpose.

As shown in FIG. 4, the first exemplary embodiment of the present invention has been explained on the assumption that two lines of short distance wires are formed for one programmable cell. However, in this exemplary embodiment, the number of short distance wires is not limited thereto but is arbitrary.

Example 1

Figure 11:
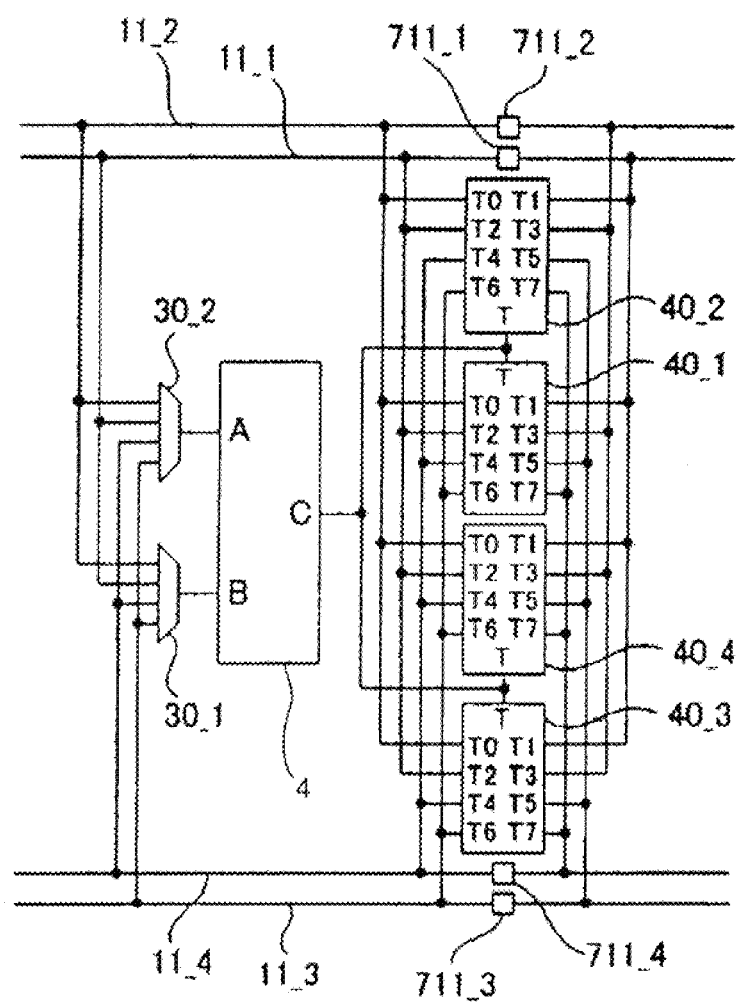
FIG. 11 is a block diagram illustrating a configuration example of a programmable cell of example 1 in the configurable circuit of the first exemplary embodiment.

This example increases the number of short distance wires annexed to a programmable cell. FIG. 11 is a block diagram illustrating a configuration example of the programmable cell of this example.

As illustrated in FIG. 11, four lines of short distance wires 11_1, 11_2, 11_3 and 11_4 are arranged for one programmable cell 1a. In this case, four direct wire connection switches 711_1, 711_2, 711_3 and 711_4 are arranged as direct wire connection switches which connect adjacent short distance wires. Moreover, four programmable switches 40_1, 40_2, 40_3 and 40_4 are arranged, and each of them has nine terminals T0, T1, T2, T3, T4, T5, T6, T7 and T.

In the programmable switch, input selector 30 and output selector 31 of FIG. 5 have four more terminals, respectively. One of terminals T0, T1, T2, T3, T4, T5, T6, T7 and T is selected to output a signal to T and a terminal other than itself, or the terminals are disconnected. In this example, any one of the following wire configurations can be set.
Four Short Distance Wires
Two two-cell long distance wires (two lines of short distance wires are connected via a direct wire connection switch)
One two-cell long distance wire and two short distance wires
One three-cell long distance wire (three lines of short distance wires are connected via a direct wire connection switch), and one short distance wire
One four-cell long distance wire (four lines of short distance wires are connected via a direct wire connection switch)

The short distance wire is driven by one programmable switch, the two-cell long distance wire is driven by two programmable switches, the three-cell long distance wire is driven by three programmable switches, and the four-cell long distance wire is driven by four programmable switches, respectively. As described above, a variety of wire configurations can be set by increasing the number of the wires and the number of the programmable switches.

In order to obtain the same performance as that of the related configurable circuit, this exemplary embodiment preferably has much fewer wires and programmable switches (or buffers) than the related configurable circuit. As explained with reference to FIG. 1, the related configurable circuit requires a long distance wire for exclusive use and a programmable switch for sufficiently driving the same to perform high speed long distance transmission. With respect to this, the first exemplary embodiment does not have such a long distance transmission path for exclusive use, but has short distance wires and programmable switches sufficient to drive the same. The high speed long distance transmission can be programmably formed using the short distance wires.

In addition, although the related configurable circuit includes many kinds of wire resources, individual application circuits use a small part of them. Although the related configurable circuit includes wire resources appropriate for different uses, respective application circuits use only a part of them. That is, most of the wire resources are not used. The related configurable circuit needs a large area because it has losses to deal with such various circuits.

On the other hand, in the first exemplary embodiment of the present invention, if necessary, it is possible to programmably form optimum transmission paths having different lengths. It is thus not necessary to form various transmission paths for exclusive use in advance. Although this example has fewer wires or programmable switches (including buffers) than the related configurable circuit, if necessary, the configurable circuit can flexibly use them as various transmission paths. Accordingly, there is never a lack of transmission paths.

As set forth herein, according to the first exemplary embodiment of the present invention, since the wires or buffers occupying a large area in the related configurable circuit can be reduced, a small area configurable circuit can be realized. In addition, when the number of the wires decreases, the input number and area of the input selectors (input selectors 30_1 and 30_2 of FIG. 4 or 11) also decrease.

Example 2

Figure 12:
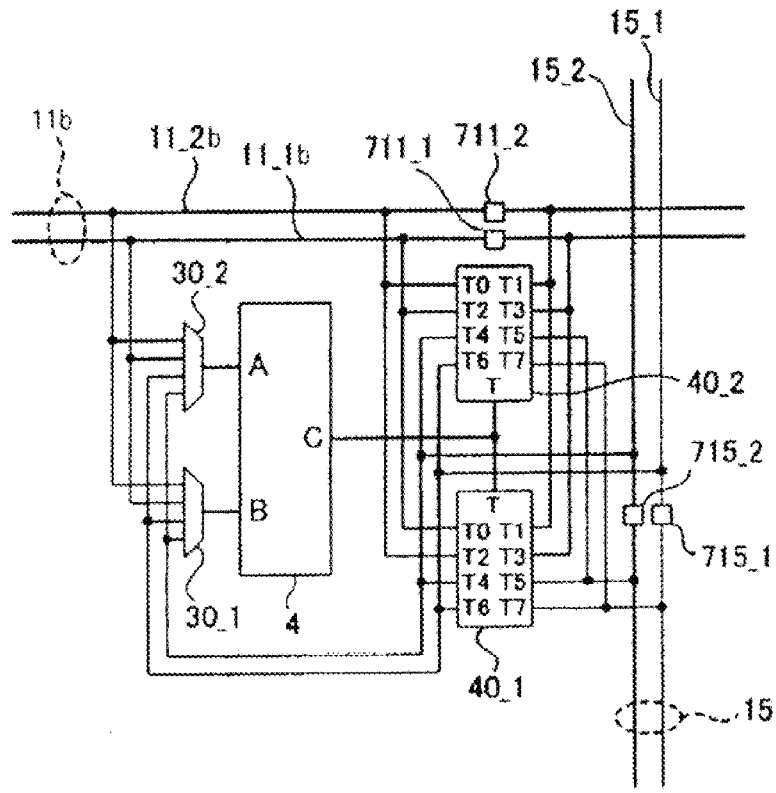
FIG. 12 is a block diagram illustrating a configuration example of a programmable cell of example 2 in the configurable circuit of the first exemplary embodiment.

In this example, short distance wire groups annexed to a programmable cell are arranged in a vertical direction as well as a horizontal direction. FIG. 12 is a block diagram illustrating a configuration example of the programmable cell of this example.

In addition to horizontal short distance wire group 11 of FIG. 4, as shown in FIG. 12, vertical short distance wire group 15 where a plurality of short distance wires are disposed in a vertical direction is arranged in programmable cell 1b of this example. Adjacent vertical short distance wires 15_x are programmably connected via direct wire connection switch 715_x (x is an integer). Also, vertical short distance wire 15_x is programmably connected to horizontal short distance wire 11_xb or output terminal C of programmable logic block 4 via programmable switch 40_x. Moreover, a signal transmitted via vertical short distance wire is input to input selector 30_x.

Figure 13:
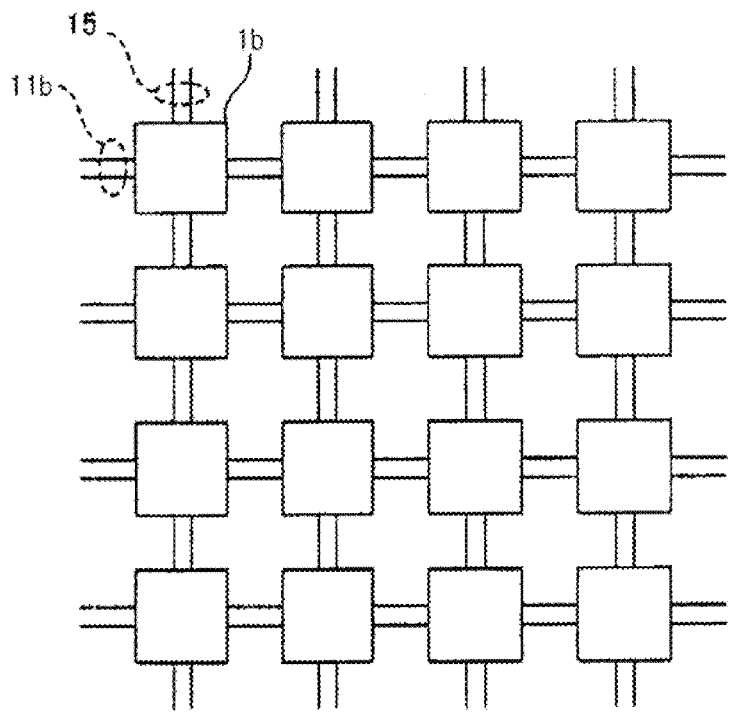
FIG. 13 is a layout view illustrating an example of use of the programmable cell of FIG. 12.

FIG. 13 is a layout view illustrating an example of use of the programmable cell of this example. As illustrated in FIG. 13, programmable cells 1b of FIG. 12 are arranged in a two-dimensional array form, and connected via horizontal short distance wire group 11b in a horizontal direction and via vertical short distance wire group 15 in a vertical direction. In the FPGA or PLD which is a typical example of the configurable circuit, as shown in FIG. 13, same programmable cells are arranged in an array form.

Second Exemplary Embodiment

Next, the second exemplary embodiment of the present invention will be explained. Meanwhile, same reference numerals are used for same elements in the first and second exemplary embodiments, and detailed explanations thereof are omitted.

Figure 14:
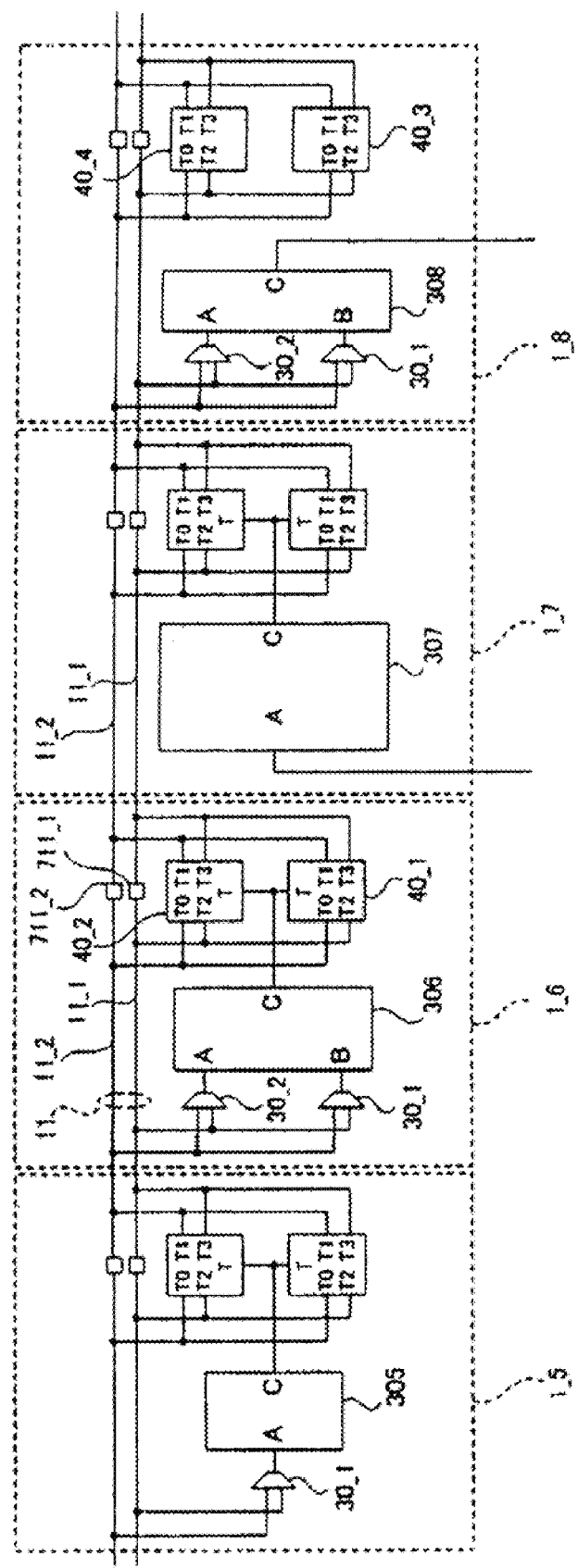
FIG. 14 is a block diagram illustrating a configuration example of a configurable circuit of a second exemplary embodiment.

FIG. 14 is a block diagram illustrating a configuration example of a configurable circuit of this exemplary embodiment. As illustrated in FIG. 14, as in the first exemplary embodiment, a plurality of programmable cells 1_x are connected via short distance wires 11_x (x is an integer). However, unlike the first exemplary embodiment, in this exemplary embodiment, the programmable cells are not identical. In FIG. 14, logic blocks 305, 306, 307 and 308 are not necessarily identical circuits, and may not be programmable.

Exemplary logic blocks include circuits for exclusive use, such as an adder, multiplier and memory unit.

In addition, in this exemplary embodiment, the number of input selectors 30_*x* (x is an integer) and the number of terminals may be different in each programmable cell. In the example of FIG. 14, two input selectors 30_1 and 30_2 are provided in each of programmable cells 1_6 and 1_8, one input selector 30_1 is provided in programmable cell 1_5, and no input selector is provided in programmable cell 1_7. Moreover, as in programmable cell 1_8, an output of logic block 308 may not be connected to programmable switch 40_*x*.

In this exemplary embodiment, short distance wire group 11, direct wire connection switches 711_*x* and programmable switches 40_*x* comprise a configurable bus. Arbitrary logic blocks are connected through the configurable bus (the logic blocks are not essentially programmable). Differently from a bus for exclusive use of the related configurable circuit, the configuration of the configurable bus can be changed after chip manufacturing, so that the same chip can be used for plural purposes. Further, it is helpful to correct bugs after manufacturing.

In a case where the entire chip is formed as a configurable circuit like the FPGA, it improves flexibility, but has a much larger area than a circuit for exclusive use. With respect to this, forming only a bus configurable to secure appropriate flexibility may be advantageous in terms of cost performance.

Figure 15:
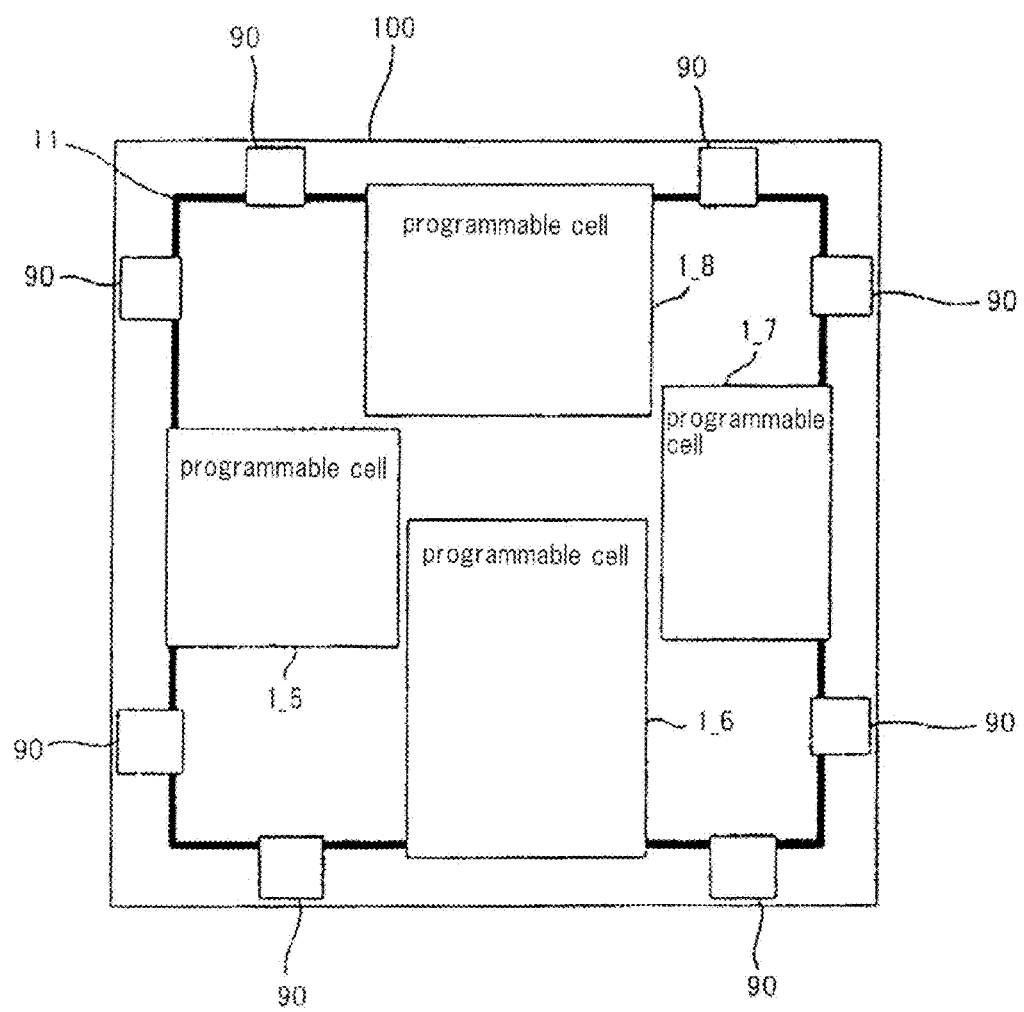
FIG. 15 is a chip layout view illustrating another example of use of the configurable circuit of FIG. 14.

FIG. 15 is a chip layout view illustrating another example of use of the configurable circuit of FIG. 14. A plurality of I/O cells 90 are arranged in a peripheral portion of chip 100, and a plurality of programmable cells 1_*x* (x is an integer) are arranged in chip 100. Such cells are connected via short distance wire group 11. I/O cell 90, which is a kind of programmable cell shown in FIG. 14, includes as a logic block a circuit for transmitting and receiving data to/from a portion other than the chip such as an I/O buffer. Many different kinds of chips may be manufactured according to more or less specification differences in the position or number of the I/O. The circuit of FIG. 15 makes it possible to arrange different kinds of chips of the related configurable circuit into one kind of chip, which reduces costs.

As explained in the first and second exemplary embodiments, in the configurable circuit of this exemplary embodiment, adjacent wires are connected via a programmable switch or a direct wire connection switch. In a case where the adjacent wires are connected via the programmable switch, a driving force of the wires in a signal transmission range is supplied from a buffer included in the programmable switch. In addition, in a case where the adjacent wires are connected via the direct wire connection switch, a long distance wire is formed and supplied with a driving force from a plurality of programmable switches. As compared with the related configurable circuit, the present invention does not need wires for long distance and short distance, respectively, and thus does not need extra wires either.

In the configurable circuit of the present invention, a plurality of short distance wires are connected via a memory-type low resistance switch element to form a long distance wire. Moreover, driving buffers for the plurality of short distance wires are coupled via a memory-type low resistance switch element to form a buffer for the long distance wire with a large driving force. In this manner, it is possible to programmably configure a long distance wire which has performance equivalent to that of a long distance wire for exclusive use. Further, since the long distance wire for exclusive use of the related configurable circuit is not necessary, the wires and buffers can be remarkably reduced. As a result, the configurable circuit can be embodied in a smaller area than the related configurable circuit.

While the invention has been particularly shown and described with reference to exemplary embodiments and examples thereof, the invention is not limited to these embodiments and examples. It will be understood by those of ordinary skill in the art that various changes in form and details may be made therein without departing from the spirit and scope of the present invention as defined by the claims.

What is claimed is:

1. A configurable circuit comprising a plurality of logic blocks, and a programmable bus which can program connections of the plurality of logic blocks, wherein said programmable bus comprises:

a plurality of wires which are arranged for each of signal transmission ranges corresponding to said plurality of logic blocks and which connect adjacent logic blocks;

a direct wire connection switch which can program whether to directly connect or disconnect said wires between adjacent said signal transmission ranges;

an input selector which is arranged to correspond to each of said plurality of logic blocks, which can program a connection with any one of said plurality of wires, and which supplies a signal of a connected wire to said logic block; and a programmable switch which is arranged for each of said signal transmission ranges and which can program whether to make a connection with said wire corresponding to adjacent said signal transmission range via a buffer for each of said plurality of wires, a plurality of programmable switches being arranged for at least one of said plurality of logic blocks, wherein said direct wire connection switch memorizes a programmed resistance state to be non-volatile, and has a smaller conduction state resistance than a MOS transistor of the same occupancy area.

2. The configurable circuit according to claim 1, wherein said programmable switch is configured to program a connection of an output of said logic block to any one of said plurality of wires between adjacent said signal transmission ranges.

3. The configurable circuit according to claim 1, wherein the number of said programmable switches connected to one of said plurality of wires or said logic block is equivalent to the number of said wires directly connected in a signal transmission direction over said signal transmission range.

4. The configurable circuit according to claim 1, wherein said plurality of programmable switches comprise a plurality of terminals connected to a shared wire of said plurality of wires.

5. The configurable circuit according to claim 1, wherein direct wire connection switches connected respectively to said plurality of wires are arranged in said input selector, any one of said plurality of wires being connected to said logic block via any one of said plurality of direct wire connection switches.

6. The configurable circuit according to claim 1, wherein said programmable switch comprises an input selector for outputting a signal of one terminal selected from a first terminal group composed of a plurality of terminals, a buffer for buffering an output signal of said input selector, and an output selector which can program whether to output an output signal of said buffer to any one terminal of a second terminal group composed of a plurality of terminals or to disconnect, wherein direct wire connection switches connected to said respective terminals of said first terminal group are arranged in said input selector, any one terminal of said first terminal group being connected to said buffer via any one of said plurality of direct wire connection switches, and direct wire connection switches connected to said respective terminals of said second terminal group are arranged in said output selector, any one terminal of said second terminal group being connected to said buffer via any one of said plurality of direct wire connection switches, or being disconnected therefrom, said second terminal group being included in said first terminal group.

7. The configurable circuit according to claim 1, wherein said plurality of logic blocks are identical circuits which can programmably set logic functions and are arranged in an array form.

8. The configurable circuit according to claim 1, wherein said plurality of logic blocks are different circuits for exclusive use which have respective fixed functions.

9. The configurable circuit according to claim 8, wherein some of said plurality of logic blocks are I/O circuit blocks disposed in a peripheral portion of a semiconductor integrated circuit.

10. The configurable circuit according to claim 2, wherein said plurality of programmable switches comprise a plurality of terminals connected to a shared wire of said plurality of wires.

11. The configurable circuit according to claim 3, wherein said plurality of programmable switches comprise a plurality of terminals connected to a shared wire of said plurality of wires.

12. The configurable circuit according to claim 6, wherein said plurality of programmable switches comprise a plurality of terminals connected to a shared wire of said plurality of wires.

13. A configuration method of a configurable circuit comprising a plurality of logic blocks, a first wire arranged for each of signal transmission ranges corresponding to said plurality of logic blocks, and a direct wire connection switch which can program whether to connect or disconnect said first wires between adjacent said signal transmission ranges, said configuration method comprising:

connecting said adjacent first wires via said direct wire connection switch to form a second wire; and programmably connecting a plurality of small driving force buffers appropriate for driving said first wires in parallel via said direct wire connection switch to form a large driving force buffer appropriate for driving said second wire.

14. The configuration method according to claim 13, wherein an input for said plurality of small driving force buffers is an output from said first wire in a signal transmission range other than said signal transmission range where said plurality of small driving force buffers are arranged.

15. The configuration method according to claim 13, wherein an input for said plurality of small driving force buffers is an output from said logic block.

16. The configuration method according to claim 13, wherein said direct wire connection switch memorizes a programmed resistance state to be non-volatile, and has a smaller conduction state resistance than a MOS transistor of the same occupancy area.

17. The configuration method according to claim 14, wherein said direct wire connection switch memorizes a programmed resistance state to be non-volatile, and has a smaller conduction state resistance than a MOS transistor of the same occupancy area.

18. The configuration method according to claim 15, wherein said direct wire connection switch memorizes a programmed resistance state to be non-volatile, and has a smaller conduction state resistance than a MOS transistor of the same occupancy area.

* * * * *